United States Patent
Song et al.

(10) Patent No.: US 9,231,213 B2
(45) Date of Patent: *Jan. 5, 2016

(54) METHODS FOR INTEGRATING AND FORMING OPTICALLY TRANSPARENT DEVICES ON SURFACES

(71) Applicant: HRL LABORATORIES LLC, Malibu, CA (US)

(72) Inventors: Hyok J. Song, Oak Park, CA (US); James H. Schaffner, Chatsworth, CA (US); Jeong-Sun Moon, Moorpark, CA (US); Kyung-Ah Son, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/560,888

(22) Filed: Dec. 4, 2014

(65) Prior Publication Data

US 2015/0084002 A1   Mar. 26, 2015

Related U.S. Application Data

(63) Continuation of application No. 13/707,373, filed on Dec. 6, 2012, now Pat. No. 8,941,095.

(51) Int. Cl.
*H01Q 1/38* (2006.01)
*H05K 1/09* (2006.01)
(Continued)

(52) U.S. Cl.
CPC ............ *H01L 51/0045* (2013.01); *H01G 13/00* (2013.01); *H01L 51/0002* (2013.01); *H01Q 1/1271* (2013.01); *H01Q 1/28* (2013.01); *H01Q 1/32* (2013.01); *H01Q 1/38* (2013.01); *H01Q 9/0407* (2013.01); *H01Q 13/10* (2013.01); *H05K 1/0274* (2013.01); *H05K 1/09* (2013.01); *H05K 1/097* (2013.01); *H05K 1/181* (2013.01);
(Continued)

(58) Field of Classification Search
None
See application file for complete search history.

(56) References Cited

U.S. PATENT DOCUMENTS 7,233,296 B2   6/2007   Song et al.
7,427,961 B2   9/2008   Song et al.
(Continued)

FOREIGN PATENT DOCUMENTS

WO   WO 2012112818 A2 *   8/2012

OTHER PUBLICATIONS

Chen, Liang-Hsiang, Pang Lin, Ming-Chou Chen, Peng-Yi Huang, Choongik Kim, Jia-Chong Ho, and Cheng-Chung Lee. "Silver Nanowire-polymer Composite Electrode for High Performance Solution-processed Thin-film Transistors." Organic Electronics 13.10 (2012): 1881-886.*

(Continued)

*Primary Examiner* — Joseph Schoenholtz
(74) *Attorney, Agent, or Firm* — Ladas & Parry (57) ABSTRACT

An apparatus, system, and/or method are described to enable optically transparent reconfigurable integrated electrical components, such as antennas and RF circuits to be integrated into an optically transparent host platform, such as glass. In one embodiment, an Ag NW film may be configured as a transparent conductor for antennas and/or as interconnects for passive circuit components, such as capacitors or resistors. Ag NW may also be used as transmission lines and/or interconnect overlays for devices. A graphene film may also be configured as active channel material for making active RF devices, such as amplifiers and switches.

30 Claims, 6 Drawing Sheets

(51) Int. Cl.

| | |
|---|---|
| H01L 21/768 | (2006.01) |
| H01L 51/44 | (2006.01) |
| H01L 51/46 | (2006.01) |
| H01L 51/10 | (2006.01) |
| H01L 51/30 | (2006.01) |
| H01L 51/00 | (2006.01) |
| H01Q 1/12 | (2006.01) |
| H01G 13/00 | (2013.01) |
| H01Q 1/28 | (2006.01) |
| H01Q 1/32 | (2006.01) |
| H01Q 9/04 | (2006.01) |
| H01Q 13/10 | (2006.01) |
| H05K 1/02 | (2006.01) |
| H05K 1/18 | (2006.01) |
| H05K 3/46 | (2006.01) |
| H05K 3/06 | (2006.01) |

(52) U.S. Cl.
CPC .............. *H05K3/067* (2013.01); *H05K 3/4644* (2013.01); *H05K 3/06* (2013.01); *H05K 2201/026* (2013.01)

(56) References Cited

U.S. PATENT DOCUMENTS

| | | | | |
|---|---|---|---|---|
| 7,847,753 | B2 | 12/2010 | Ishibashi | |
| 8,466,366 | B2 | 6/2013 | Srinivas et al. | 174/126.1 |
| 2010/0127241 | A1 | 5/2010 | Gruner | |
| 2010/0220019 | A1 | 9/2010 | Boote | 343/713 |
| 2011/0068994 | A1 | 3/2011 | Matsuoka | 343/841 |
| 2011/0170330 | A1 | 7/2011 | Oezyilmaz | |
| 2012/0077680 | A1 | 3/2012 | Berggren et al. | 505/160 |
| 2012/0100886 | A1 | 4/2012 | Man et al. | 455/550.1 |
| 2012/0125660 | A1 | 5/2012 | Bright | 174/126.4 |
| 2012/0154248 | A1 | 6/2012 | Haque | |
| 2012/0161106 | A1 | 6/2012 | Kim | |
| 2012/0248416 | A1 | 10/2012 | Zhou | |
| 2012/0319096 | A1 | 12/2012 | Rinzler et al. | 257/40 |
| 2013/0078449 | A1 | 3/2013 | Naito et al. | 428/324 |

OTHER PUBLICATIONS

U.S. Appl. No. 13/703,373, filed Dec. 6, 2012, Song et al.

H. J. Song, T. Y. Hsu, D. F. Sievenpiper, H. P. Hsu, J. Schaffner, and E. Yasan, "A Method for Improving the Efficiency of Transparent Film Antennas," IEEE Antennas and Wireless Propag. Lett., vol. 7, 2008, pp. 753-756.

J. Hautcoeur, F. Colombel, X. Castel, M. Himdi, and E. M. Cruz, "Performance of Transparent Monopole Antenna Versus Meshed Silver Layer (AgGL)," 2010 Proceeding of the Fourth European Conference on Antennas and Propagation (EuCAP), Barcelona, Apr. 12-16, 2010.

A. Katsounaros, Y. Hao, N. Collings, and W. A. Crossland, "Optically Transparent Ultra-Wideband Antenna," Electronics Letts., vol. 45, No. 14, Jul. 2, 2009. pp. 722-723; and U.S. Pat. No. 7,847,753, B2, 7,233,296 and 7,427,961.

A. Suresh, P. Wellenius, V. Baliga, H. Luo, L. M. Lunardi, and J. Muth, "Fast All-transparent Integrated Circuits Based on Indium Gallium Zinc Oxide Thin-film Transistors, IEEE Electron Device Letts," vol. 31, No. 4, Apr. 2010, pp. 317-319.

C.-T. Lee, W.-M. Shien, H.-Y. Lee, "Zno:Al Based Transparent Thin Film Transistors," Proceedings of the 21st Annual Meeting of the IEEE Lasers and Electro-Optics Society, 2008 LEOS, Acapulco, Nov. 9-18, 2008, p. 65.

S. Ju, A. Facchetti, et al., "Fabrication of Fully Transparent Nanowire transistors for Transparent and Flexible Electronics," Nature Nanotechnology 2, pp. 378-384, 2007.

M. Dragoman, A.A. Muller, D. Dtragoman, F. Coccetti, and R. Plana, "Terahertz Antenna Based on Graphene," J. of Applied Physics, vol. 107, No. 10, 104313, 2010.

Li, W., et al., "A Novel Frequency Selective Surface with Improved Miniaturization Performance", J. of Electromagnetic Analysis and Applications, 2012, 4, pp. 108-111.

Kiani, G., et al., Glass Characterization for Designing Frequency Selective Surfaces to Improve Transmission through Energy Saving Glass Windows:, Proceedings of Asia-Pacific Microwave Conference, 2007.

Rai, T. et al., "A Stretchable RF Antenna with Silver Nanowires", IEEE Electron Devices, vol. 34, No. 4, 2013, pp. 544-546.

Joram, C. Transmission Curves of Plexiglass (PMMA) and Optical Grease:, PH-EP Tech Note (2009).

Soltani, M., et al., Thermochromic Vandium Diioxide (VO2) Smart Coatings for Switching Applications:, Applied Physics in the $21^{st}$ Century, Edited by Xin Chen (2008) pp. 1-23.

"Nickel Etchants" downloaded from URL<http:/www.transene.com/ni_etchant.html> on Nov. 2013.

Liu, Bo-Tau, Han-Lin, "Graphene/silver Nanowire Sandwich Structures for Transparent Conductive Films", Carbon, vol. 63, Nov. 2013, pp. 390-396.

Yasuoka, Y., "Thin Film Antennas for Millimeter and Submillmieter Waver Radiation", International Conference on Terahertz Electronics [$8^{th}$], Darmstaadt, Germany on Sep. 28-29, 2000.

Li, R.L.., et al. "Development of a Cavity-Backed Broadband Circularly Polarized Slot/Strip Loop Antenna With a Simple Feeding Structure", IEEE Transactions on Antennas and Propagation, vol. 56, No. 2, Feb. 2008, pp. 312-318.

Madaria, A., et al. "Uniform, Highly Conductive, and Patterned Transparent Films of a Percolating Silver Nanowire Network on Rigid and Flexible Substrates Using a Dry Transfer Technique", Nano Res (2010) 3:pp. 564-573.

Liu, Ch., et al., Silver Nanowire-Based Transparent, Flexible, and Conductive Thin-Film, Nanoscale Research Letters 2011, 6:75 pp. 1-8.

Komoda, N., et al., "Printed silver nanowire antennas with low signal loss at high-frequency radio", Nanoscale, 2012, 4, 3148-3153.

Rossouw, D., et al., "Multipolar Plasmonic Resonances in Silver Nanowire Antennas Imaged with a Subnanometer Electron Probe", Nano Lett., 2011, 11 (4), pp. 1499-1504.

Ito, K., et al., "See-through Microstrip Antennas Constructed on a Transparent Substrate" in Proc. of $7^{th}$ Inte. Conf. on Antennas and Propagation, York, UK Apr. 1991 pp. 133-136.

Azini, A., et al., "Transparent Antenna Design for WiMAX Application" Progress in Electromagnetics Research, (2013) vol. 138, pp. 133-141.

Van De Groep, J., et al., Transparent Conducting Silver Nanowire Networks :, Nano Lett. 2012, 12, pp. 3138-3144.

Ullah, I., et al., "Selective Transmission of RF Signals Through Energy Saving Glass for Smart Buildings" Edith Cowan University Research Week, Aug. 2011.

PCT International Search Report and Written Opinion mailed on Feb. 24, 2014 from corresponding PCT application PCT Application No. PCT/US2013/069317.

Chapter II International Preliminary Report on Patentability (IPRP) for PCT/US2013/069317 dated Oct. 14, 2014.

From U.S. Appl. No. 13/707,373 (Unpublished; Request not to publish) Non-Final Office Action dated Dec. 9, 2013.

From U.S. Appl. No. 13/707,373 Non-Final Office Action dated Mar. 20, 2014.

From U.S. Appl. No. 13/707,373 Final Office Action dated Jun. 12, 2014.

From U.S. Appl. No. 13/707,373 Notice of Allowance dated Sep. 8, 2014.

\* cited by examiner

METHODS FOR INTEGRATING AND FORMING OPTICALLY TRANSPARENT DEVICES ON SURFACES

CROSS REFERENCE TO RELATED APPLICATION

This application is a continuation application of U.S. patent application Ser. No. 13/707,373, filed on Dec. 6, 2012, which is incorporated herein by reference as though set forth in full.

FIELD OF THE INVENTION

The present invention relates generally to integration and formation of optically transparent active and passive devices in or on surfaces.

BACKGROUND

Recent advances in and the increased number of Radio Frequency (RF)-based systems has escalated manufacturing efforts to design antennas more suitable for use with such systems. For example, antennas may be found on vehicles or aircrafts. Several requirements are needed to meet antenna design constraints, including bandwidth and size. Moreover, antennas require adequate space to ensure optimal operation and performance. Designing antennas for vehicle or aircraft has been difficult, as the design and aerodynamic constraints for such vehicles, make the space for an antenna limited. Accordingly, it would be practical and economic to use existing space on vehicles or aircrafts to design antennas to avoid space restrictions. One example of a usable surface would be the glass surfaces on such vehicles.

Several examples of antennas have been researched, including passive transparent antenna designs. Some examples include H. J. Song, T. Y. Hsu, D. F. Sievenpiper, H. P. Hsu, J. Schaffner, and E. Yasan, "A Method for Improving the Efficiency of Transparent Film Antennas," *IEEE Antennas and Wireless Propag. Lett.*, Vol. 7, 2008, pp. 753-756; J. Hautcoeur, F. Colombel, X. Castel, M. Himdi, and E. M. Cruz, "Performance of Transparent Monopole Antenna Versus Meshed Silver Layer (AgGL)," 2010 *Proceeding of the Fourth European Conference on Antennas and Propagation (EuCAP)*, Barcelona, Apr. 12-16, 2010; A. Katsounaros, Y. Hao, N. Collings, and W. A. Crossland, "Optically Transparent Ultra-Wideband Antenna," *Electronics Letts.*, Vol. 45, No. 14, Jul. 2, 2009. pp. 722-723; and U.S. Pat. Nos. 7,847,753, B2, 7,233,296 and 7,427,961.

Additionally, optically transparent transistors have been described by A. Suresh, P. Wellenius, V. Baliga, H. Luo, L. M. Lunardi, and J. Muth, "Fast All-transparent Integrated Circuits Based On Indium Gallium Zinc Oxide Thin-film Transistors," *IEEE Electron Device Letts*," Vol. 31, No. 4, April 2010, pp. 317-319; C. T. Lee, W. M. Shien, H. Y. Lee, "Zno:Al Based Transparent Thin Film Transistors," *Proceedings of the 21st Annual Meeting of the IEEE Lasers and Electro-Optics Society*, 2008 LEOS, Acapulco, Nov. 9-18, 2008, pg. 65; and S. Ju, A. Facchetti, et al., "Fabrication of Fully Transparent Nanowire transistors for Transparent and Flexible Electronics," *Nature Nanotechnology* 2, pp. 378-384, 2007. These references do not describe antennas used with a transparent substrate.

Antennas have also been proposed with graphene. An example is described in M. Dragoman, A. A. Muller, D. Dtragoman, F. Coccetti, and R. Plana, "Terahertz Antenna Based On Graphene," *J. of Applied Physics*, Vol. 107, No. 10, 104313, 2010.

None of these examples describes an optically transparent RF functioning surface. Therefore, a need exists for methods, systems, and devices that include optically transparent active circuits with optically transparent passive electromagnetic structures, such as antennas, for use in or on a surface.

SUMMARY

In one aspect, a device includes a transparent or substantially transparent substrate and a silver nanowire film. The silver nanowire film may be disposed to at least a portion of the substrate, and a dielectric material may be applied to at least a portion of the silver nanowire film.

In another aspect, a method is described forming a passive electrical device that includes providing a transparent or substantially transparent substrate including a silver nanowire film, etching the silver nanowire film; and coating a portion of the silver nanowire film with a dielectric material.

In yet another aspect, a device is disclosed that includes a substantially transparent substrate, a gate electrode, a graphene film; and a plurality of contacts formed from silver nanowire on a portion of the graphene film. The device may include an antenna, a Frequency Selective Surface (FSS), a resistor, capacitor, or an inductor. The gate electrode may be formed from gold, copper, Indium-tin Oxide (ITO), or Indium-zinc Oxide (IZO).

In yet another aspect, a method is disclosed that includes providing a transparent or substantially transparent substrate, forming a graphene film on a portion of the substrate, forming an electrical device, and forming a plurality of contacts on the graphene film from silver nanowire.

BRIEF DESCRIPTION OF THE DRAWINGS

The invention(s) may be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Apparatus, systems, and/or methods are described to enable optically transparent reconfigurable integrated electrical components, such as antennas and RF circuits to be integrated into an optically transparent host platform or transparent or substantially transparent substrate or surface, such as glass or plexiglass. The disclosed structures may be configured with or used with RF-based systems. In one embodiment, a silver nanowire (Ag NW) film may be configured as a transparent conductor for antennas and/or as interconnects for passive circuit components, such as capacitors, inductors, or resistors. Ag NW may also be used as transmission lines and/or interconnect overlays for devices. A graphene film may also be configured as an active channel material for making active RF devices, such as amplifiers and switches.

The disclosed embodiments provide a completely or substantially complete optically transparent RF front end that may be integrated into a glass or optically transparent host platform, which provides design flexibility for antennas and RF systems. Without implying a limitation, an RF front end may include components for receiving and/or transmitting, an antenna interface, a low noise amplifier or an interface to a digital baseband system, such as an analog to digital converter.

In one embodiment, a surface for antennas and RF circuits enables reconfigurable antennas and RF active circuits to be integrated directly into or on the glass located around the vehicles, aircraft, buildings, and other structures or electronic devices. The disclosed methods may expand antenna design space to any glass on or around automobiles and aircraft. Various optically transparent RF structures, components and antennas may be formed into window glass and other glass structures.

The disclosed structures may lead to lower cost monolithic fabrication in which optically transparent passive and active structures are formed on an integrated circuit or chip. In one embodiment, the use of monolithic fabrication may form complete receivers on glass. Further, the demodulated signal output interface, e.g., interconnects and/or wiring, for a vehicle or aircraft may be configured for low frequencies. In regions away from the RF circuits, the disclosed structures may also serve as a solar reflective film that leads to a reduction of a thermal load of a vehicle, such as automotive vehicles. Other suitable applications may include millimeter wave phased array antennas embedded in or on glass and active electromagnetic (EM) shielding.

In one embodiment, the integration of optically transparent RF components and RF front ends in/on optically non-opaque glass or plexiglass or any similar optically transparent host may be achieved for flat or curved surfaces. An optically transparent host platform or surface, such as glass, may be used as a substrate for either an antenna or RF components/circuits.

In one embodiment, customized RF-functionality, such as radio frequency selectivity, amplification, switching, and/or mixing, may be embedded in or on the optically transparent host platform. In one embodiment, the disclosed antennas operate at microwave frequencies. In other embodiments, the dimensions of the antenna may be modified to support or operate at other frequencies.

In one embodiment, an optically transparent diversity antenna(s) may be integrated in or on the host platform or surface by integrating optically transparent switch(es) and antenna(s). A diversity antenna may include two or more antennas configured to receive at least two incoherent signals. An optically transparent, tunable frequency selective surface may be integrated in or on the optically transparent platform with optically transparent frequency tuning components and circuits, such as a graphene metal insulator semiconductor (MIS) varactors or other MIS structures.

In one embodiment, an increase in effective conductivity of Ag NW antennas, transmission lines, or interconnects may be achieved by embedding a thin conductor, e.g., less than 10-12 micron wide conductor having a high conductivity of about $10^7$ S/m, along an edge of the antennas, transmission lines, or interconnects. Suitable materials for the thin conductors may include gold, copper or similar material. Currents in the thin conductor may flow along the edges due to skin effects.

The disclosed embodiments and methods may increase effective conductivity of Ag NW or other transparent conductors by selectively controlling local conductivity of the Ag NW or transparent conductors. The areas of high density current flows, such as along edges of a conductor or a slot, may be maintained by applying a high conductivity conductor, such as gold. Conductivity of the embedded conductive lines may be about at least an order of magnitude more than that of a lossy transparent conductor to increase the effective conductivity.

In another embodiment, an increase in local conductivity may be achieved by selectively doping the local areas of graphene or transparent conductors. An increase in local conductivity may be achieved by selectively increasing a density of Ag NW or controlling a number of graphene layers or thickness of the transparent conductor films in selected local areas. In one embodiment, a graphene resistor is provided with resistance control by controlling 1) defects in graphene, 2) doping in graphene, or 3) a number of graphene layers.

The local selective conductive control methods may be applied to increase an effective conductivity or decrease in effective resistance of lossy conductors, such as transparent or opaque conductors. The methods may also apply to any RF and non-RF structures including transmission lines in any configuration, e.g. a co-planar waveguide (CPW), microstrip, and/or strip, antennas or any radiating structures in any configurations, and/or interconnects and pads in any configurations. The described methods may provide Ag NW as transparent interconnects for active RF devices, e.g., transistors, diodes, Ag NW antennas, or Ag NW transmission lines, such as CPW, microstrip, or strip lines.

Transparent active devices on a substrate, such as glass, may require desired electrical, thermal, or mechanical properties. In one embodiment, graphene may be used as an optically transparent material and may include (1) high channel mobility, e.g., >1000 cm$^2$/Vs, (2) high flexibility to enable transfer of the graphene film to curved surfaces, or (3) a high thermal conductivity providing sufficient thermal dissipation capability on glass.

Figure 1:
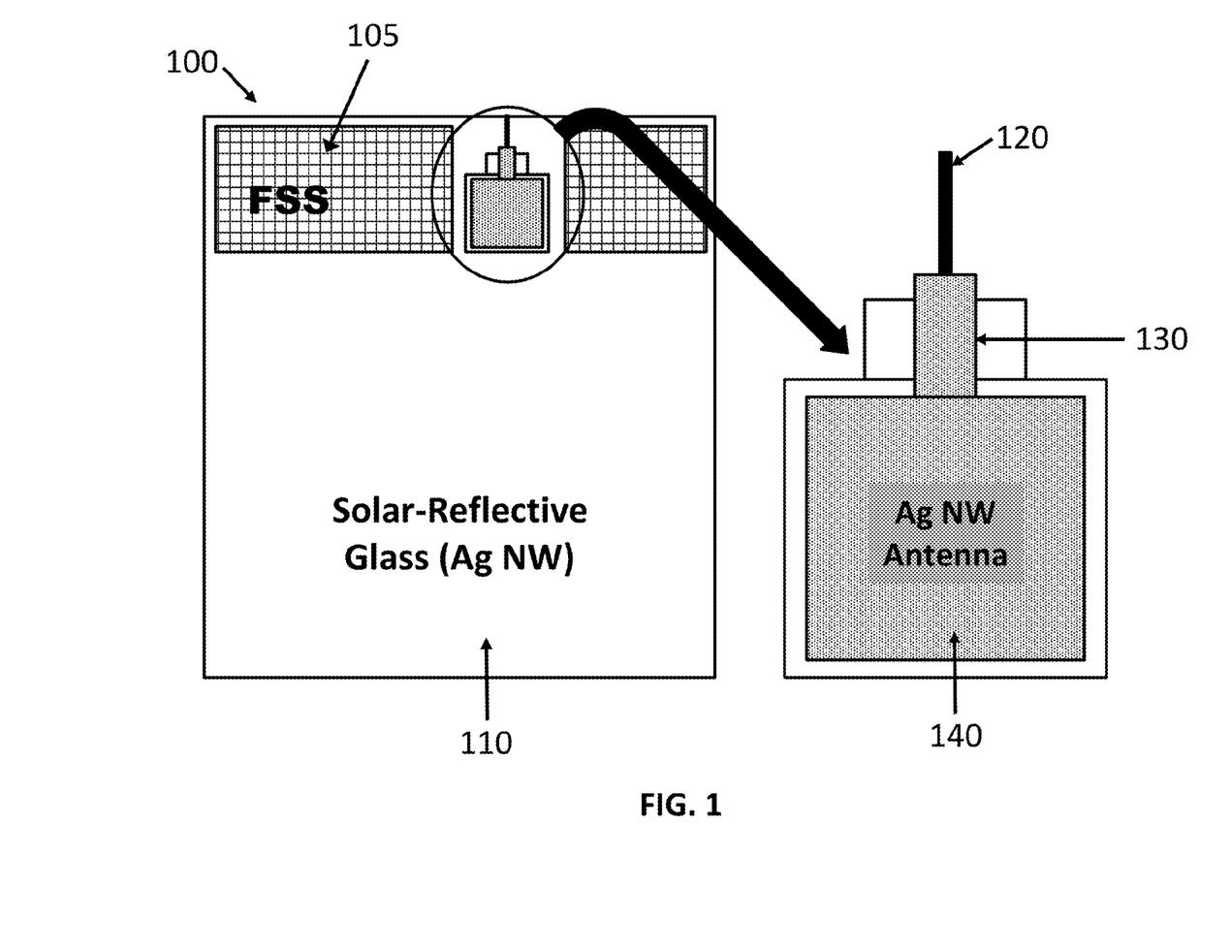
FIG. 1 illustrates a passive RF structure and an integrated component in an embodiment.

FIG. 1 illustrates a passive RF structure 105 and an component 140 integrated onto a substrate in an embodiment 100. The passive RF structure 105, such as a Frequency Selective Surface (FSS), is shown coupled to and/or fabricated with an integrated component 140, such as an active antenna onto a substrate 110. The substrate 110 may be made of glass. A portion of the substrate 110 may also be coated with Ag NW for use as a solar reflective glass. An Ag NW film may be used as a transparent conductor for the component 140 or as an interconnect for passive circuit components. A graphene film may be used as transparent active channel material for making active RF devices, for example, a transistor. The component 140 may include a data out or intermediate frequency (IF) out port and a graphene low noise amplifier 130.

Figure 2:
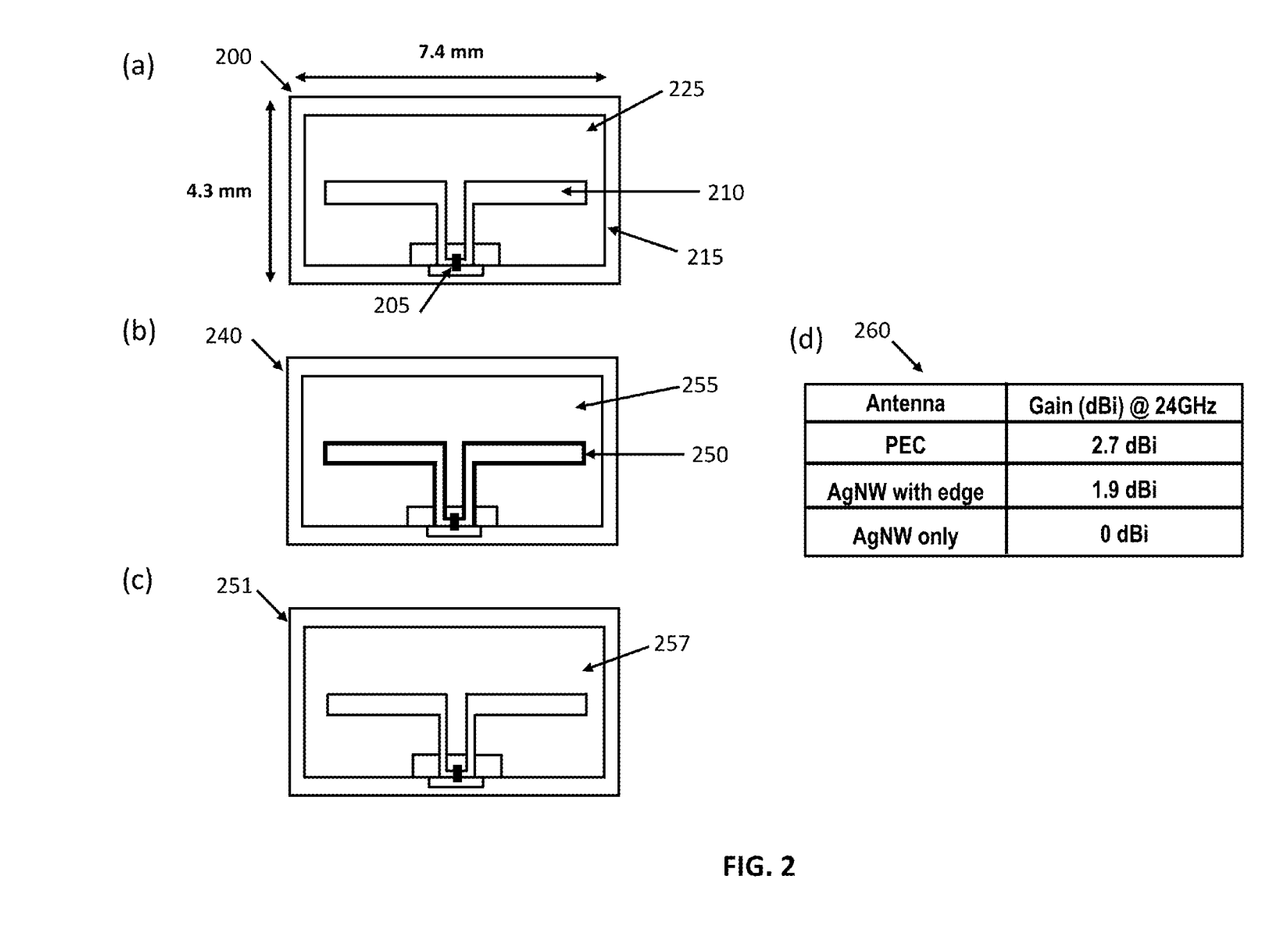
FIGS. 2(a)-2(c) illustrate coplanar waveguide (CPW) fed slot antennas in various embodiments.
FIG. 2(d) is a table showing maximum gain performance for the antennas of FIG. 2(a)-2(c).

FIGS. 2($a$)-2($c$) illustrate coplanar waveguide (CPW) fed slot antennas in various embodiments. Referring to FIG. 2($a$), an antenna 200 is shown as an ideal reference antenna and includes a perfect electrical conductor (PEC) 225 and regions of glass 210 and 215. A PEC may be a conductor that does not produce losses and used to model antenna 200. In one embodiment, gold or copper may be in a realization of the antenna 200. In one embodiment, a realized gain may be approximately 2.7 dBi. The antenna 200 further includes an antenna feed point 205. In one example, the antenna may have a width of about 7.4 mm and height of about 4.3 mm. The antenna 200 may be configured with other heights and widths depending on the application.

FIG. 2(b) illustrates an antenna 240 similar to antenna 200 including a portion 255 formed from Ag NW in place of the PEC with a metal edge 250 formed along a slot. FIG. 2(c) shows an antenna 251 similar to antenna 240 without the metal edge 250. FIG. 2(d) illustrates a table 260 of electromagnetic simulation results in terms of antenna gain for the CPW fed slot antennas of FIGS. 2(a)-2(c). Full electromagnetic simulation of the Ag NW antenna shows broadband performance at around 24 GHz with a maximum gain of better than 0 dBi at 24 GHz. In one embodiment, the antenna 240, 251 may be formed from copper or suitable conducting material.

An Ag NW antenna may be formed in one embodiment as follows. Ag NW in a solution form may be applied or formed onto a host platform or surface. In one embodiment, the Ag NW may be sprayed or spin coated on a glass substrate, such as a Pyrex® glass, or similar substrate. The Ag NW coated glass substrate may then be treated with acid to remove any oxidation layer and to enhance conductivity. A capping layer of aluminum oxide ($Al_2O_3$), silicon dioxide ($SiO_2$), hafnium oxide ($HfO_2$), or any dielectric metal oxide may then be formed or applied to the Ag NW coated glass by atomic layer deposition (ALD), which is then followed by suitable lithography, etching and/or cleaning processes to pattern antennas, wires and interconnects. In one embodiment, the capping layer may be applied to or formed on the Ag NW coated glass using spin coating, spray deposition, or chemical vapor deposition (CVD).

In one embodiment, the Ag NW coated glass may be etched prior to coating with a dielectric material. The etchant may be an acid-based etchant, and may be used without dilution. An example of a suitable etchant may be found under the trade name Nickel etchant TFB available from the Transene Company, Inc., and may have chemical components including 15-20% nitric acid, less than one percent potassium perfluoroalkyl sulfonate, and water.

In one embodiment, a CPW fed slot type of Ag NW antenna may be designed and fabricated on glass for 24 GHz frequency band. Other suitable antenna designs may also be supported to achieve different frequency ranges.

In one embodiment shown in FIG. 2(b), an antenna efficiency of about 50% or greater with transparent conductors having an optical transmittance of about 70% or more due to low conductivity (or equivalently a high sheet resistance) may be achieved. In one embodiment, an Ag NW may be formed as the transparent conductor material for the antenna and graphene may be formed as a transparent active channel for the RF circuits due to electrical, thermal and/or mechanical properties. In one embodiment, Ag NW film with the sheet resistance of less than 10 ohm/square at 85% optical transmission, and graphene having the sheet resistance of 50 Ω/sq at 50% optical transmittance may be used.

In one embodiment, efficiency of antennas or passive RF structures or interconnects made of Ag NW film may be increased by selectively enhancing the conductivity at edges of antenna radiator(s) or passive RF structures, including transmission lines or interconnects by embedding or adding thin strips, e.g. less than 10-12 microns, of higher conductivity metal where the currents are concentrated. In one embodiment, the strips may be added or embedded near or around edge 250. This selective conductivity control approach may be also facilitated by selectively controlling the Ag NW layer density.

It has been determined that the selective conductivity control method may improve a gain of the 50 Ω/sq transparent conductor antenna with 90% optical transmittance from −8.1 dBi to −2.4 dBi. It has also been determined that for a 120 micron long CPW line made from Ag NW having a sheet resistance of 5 ohm/sq, embedding 6 micrometer wide metal conductors along the edges of CPW line reduces a transmission loss from −0.88 dB to −0.025 dB, as shown in FIG. 2(b). An increase in antenna gain may also be obtained by integrating a transparent transistor amplifier with the antenna in the monolithic fabrication process, which may form an active antenna. Other RF functionality such as switching and mixing may be fabricated into the RF substrate in a similar manner.

Figure 3:
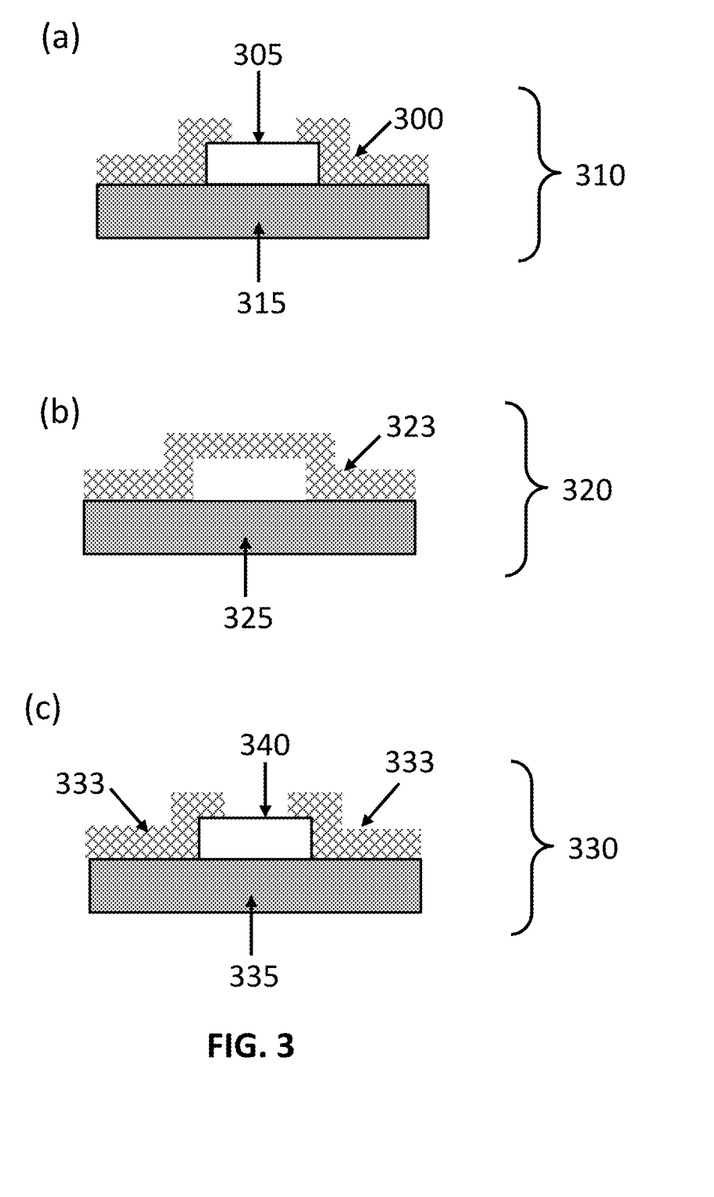
FIGS. 3(a)-3(c) illustrate cross-sectional views of optically transparent components in various embodiments.

FIGS. 3(a)-3(c) illustrate cross-sectional views of optically transparent components in various embodiments. In one embodiment, an optically transparent passive resistor 310, inductor 320, and/or capacitor 330 components may be formed. The passive components may use Ag NW for transparent interconnects.

Referring to FIG. 3(a), the resistor 310 may be formed on a glass substrate 315 with a layer of Ag NW 300 on a portion of the substrate 315. Graphene 305 may be used as a resistance material for the resistor and a desired resistance may be obtained by introducing controlled defects e.g. holes, slots, or similar structures, in the graphene, by controlling doping in graphene or controlling a number of graphene layers, controlling a width and/or length of the Graphene.

FIG. 3(b) shows an inductor 320 formed on a glass substrate 325 and a layer of Ag NW 323 on a portion of the substrate 325. The inductor 320 may be formed made from Ag NW using general spiral geometry. In one embodiment, the inductor may be formed by an etching process. FIG. 3(c) shows a capacitor 330 which may be formed using silicon nitride (SiNx) or hafnium oxide ($HfO_2$) as a transparent dielectric material with Ag NW as ohmic contacts. Embedding of thin conductors to Ag NW may be applied when forming the passive components in order to increase effective conductivity of the Ag NW.

Graphene may be grown on silicon (Si) and silicon carbide (SiC) wafer. The graphene film may be transferred onto a glass or transparent substrate or surface. The graphene film may be physically transferred onto a glass or transparent substrate by using a thermal release tape as a transfer medium. The graphene film may also be transferred using other known methods.

Figure 4:
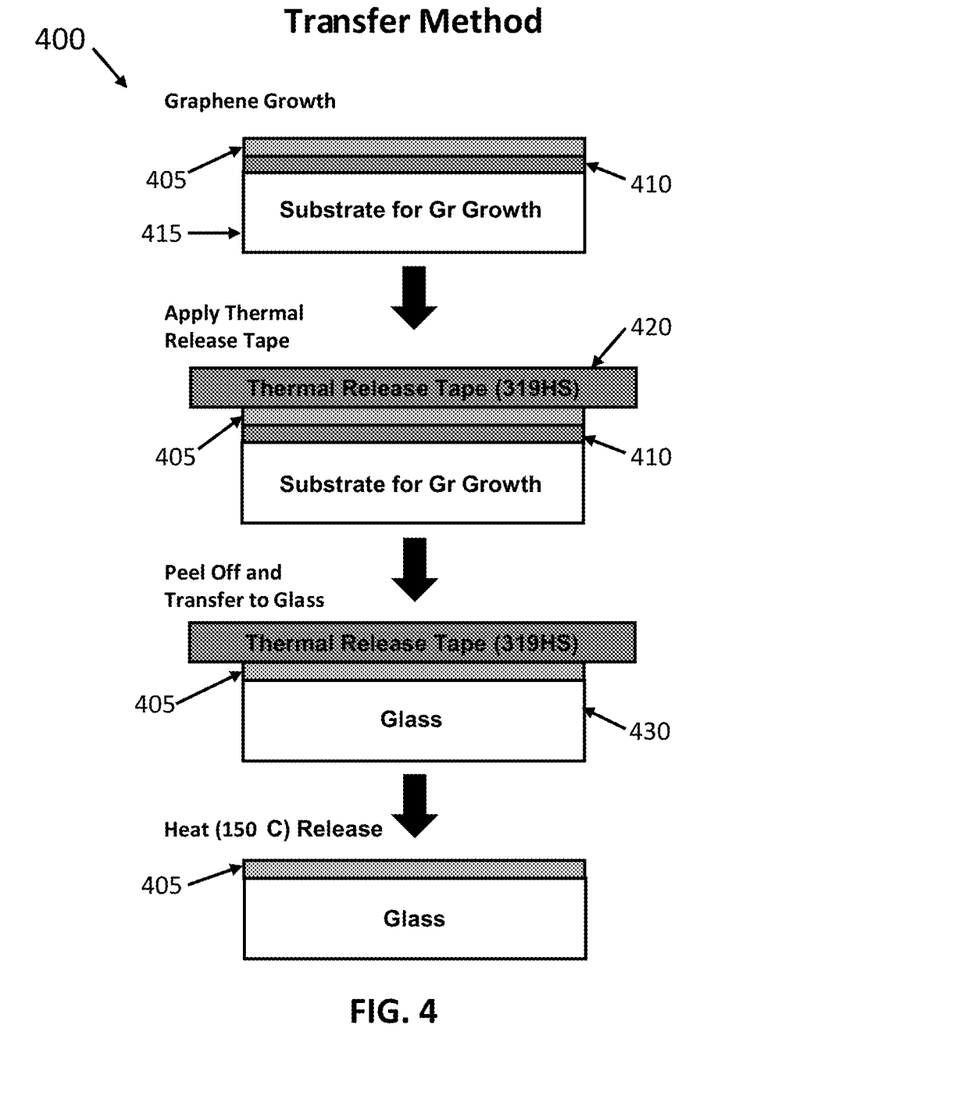
FIG. 4 illustrates a system and/or method of transferring graphene to a substrate using a thermal release tape in an embodiment.

FIG. 4 illustrates a method of transferring graphene using a thermal release tape in an embodiment 400. The graphene layer 405 may be grown on a copper catalyst 410 on a substrate for graphene growth 415. A thermal release tape 420 may be applied to the graphene 405. The tape 420 may be peeled from the substrate in a conventional manner and applied to a substrate made from glass 430. Heat may be applied to the tape 420 at a suitable temperature to transfer the graphene to the glass substrate 430. One suitable temperature may be about 150° C.

Figure 5:
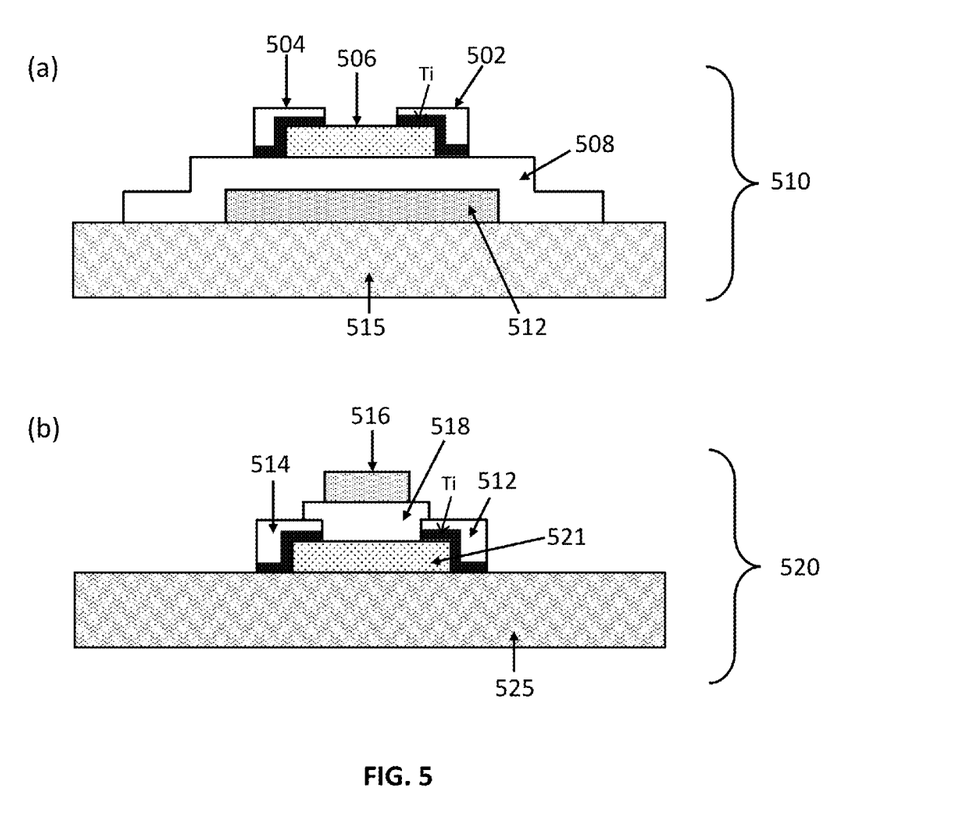
FIGS. 5(a) and 5(b) illustrate cross-sectional views of an optically transparent Field Effect Transistor (FET) in an embodiment.

FIGS. 5(a)-5(b) illustrate an example of a fully transparent transistor that may be formed using graphene as an active channel layer and Ag NW as source and drain interconnect metal on top of a thin Ti/Au ohmic contact metal. Thin copper, Indium-tin Oxide (ITO) or Indium-zinc Oxide (IZO) may be used as optically transparent gate metal. The gate metal may have a thickness of tens of nanometers. FIGS. 5(a)-5(b) illustrate cross-sectional views of an optically transparent Field Effect Transistor (FET) in an embodiment.

Referring to FIG. 5(a), a cross-sectional view of the bottom-gate FET 510 having a source 504 and a drain 502, each formed from Ag NW and a layer of graphene 506 formed on a portion of an insulator 508. The FET 510 may also include a gate 512 and a substrate 515. FIG. 5(b) shows a cross-sectional view of a top-gate FET 520 including a source 514 and a drain 512, each formed from Ag NW. The FET 520 further includes a gate 516 formed on at least a portion of an insulator 518. A layer of graphene 521 is configured between the insulator 518 and a substrate 525.

Figure 6:
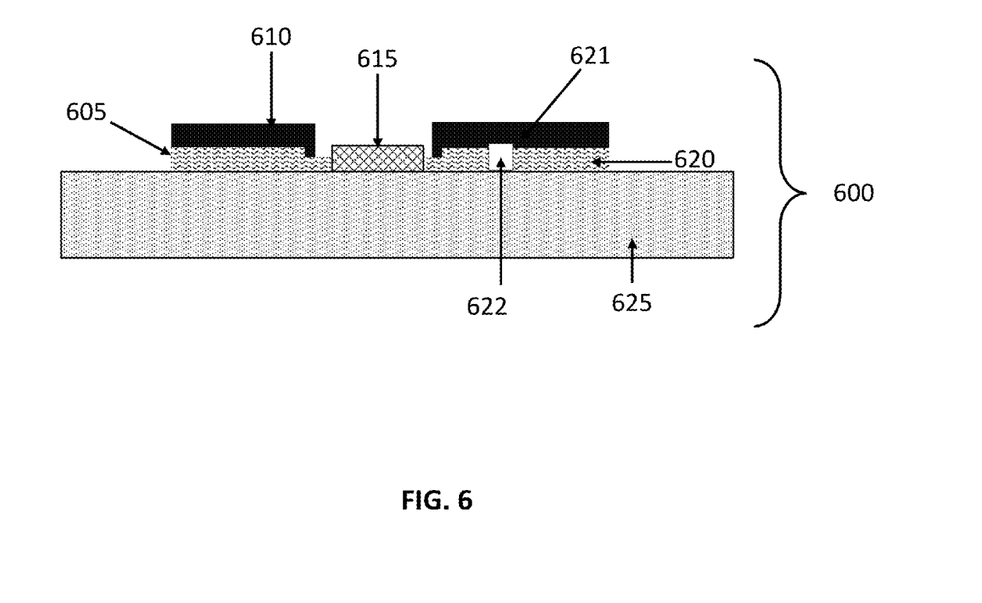
FIG. 6 illustrates a cross-sectional view of an optically transparent graphene active RF device integrated with optically transparent passive RF structures in an embodiment.

FIG. 6 illustrates a cross-sectional view of an optically transparent graphene active RF device 615 integrated with optically transparent passive RF structures in an embodiment 600. As shown, the active RF structure 615 may be monolithically fabricated on a transparent substrate or substantially transparent substrate 625. The graphene active device 615 may represent the device shown in FIGS. 5(a)-(b). A graphene layer 610 may be optionally left on top of an Ag NW layer 605 to provide mechanical strength, thermal management, or a resistance to abrasion. The structure 600 may also include an Ag NW antenna 620, one or more slots 622, which may be configured as part of the CPW-fed slot antenna structure, and one or more thin metal lines 621. Active RF circuits generally require a thermal management capability. In one embodiment, carbon-based graphene e.g., 4840-5300 W/mK may be used to provide thermal dissipation of active RF circuits on or in the glass substrate.

The foregoing description of the preferred embodiments of the present invention has been presented for purposes of illustration and description. It is not intended to be exhaustive or to limit the invention to the precise form or to exemplary embodiments disclosed. Obviously, many modifications and variations will be apparent to practitioners skilled in this art. Similarly, any process steps described might be interchangeable with other steps in order to achieve the same result. The embodiment was chosen and described in order to best explain the principles of the invention and its best mode practical application, thereby to enable others skilled in the art to understand the invention for various embodiments and with various modifications as are suited to the particular use or implementation contemplated. It is intended that the scope of the invention be defined by the claims appended hereto and their equivalents. Reference to an element in the singular is not intended to mean "one and only one" unless explicitly so stated, but rather means "one or more." Moreover, no element, component, nor method step in the present disclosure is intended to be dedicated to the public regardless of whether the element, component, or method step is explicitly recited in the following claims. No claim element herein is to be construed under the provisions of 35 U.S.C. Sec. 112, sixth paragraph, unless the element is expressly recited using the phrase "means for . . . ."

It should be understood that the figures illustrated in the attachments, which highlight the functionality and advantages of the present invention, are presented for example purposes only. The architecture of the present invention is sufficiently flexible and configurable, such that it may be utilized (and navigated) in ways other than that shown in the accompanying figures.

Furthermore, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way. It is also to be understood that the steps and processes recited in the claims need not be performed in the order presented.

The invention claimed is:

1. A device, comprising:
   one of a transparent and substantially transparent substrate;
   an optically transparent active device on the substrate, wherein the optically transparent active device comprises a plurality of silver nanowire contacts and a graphene channel;
   a silver nanowire film, the silver nanowire film disposed on at least a portion of the substrate; and
   a dielectric material disposed on at least a portion of the silver nanowire film.

2. The device of claim 1 further comprising one or more of an antenna, interconnects, transmission lines, a Frequency Selective Surface, a resistor, capacitor, or an inductor.

3. The device of claim 1, wherein substrate is formed at least in part from one of glass and plexiglass.

4. The device of claim 2, wherein the antenna is configured to operate at one of RF, microwave and millimeter-wave frequencies.

5. The device of claim 2, wherein the antenna comprises one of a silver nanowire film, a metal line and a slot formed on the substrate.

6. The device of claim 2 further comprising a conductor embedded along an edge of one of the antenna, interconnect, and transmission line.

7. The device of claim 2, wherein the capacitor comprises one of silicon nitride and hafnium oxide ($HfO_2$), and the silver nanowire film is configured as an ohmic contact.

8. The device of claim 2, wherein the dielectric material comprises one of aluminum oxide ($Al_2O_3$), silicon dioxide ($SiO_2$), and hafnium oxide ($HfO_2$).

9. The device of claim 1 wherein the optically transparent active device comprises:
   a gate electrode on the substrate;
   an insulator on the gate electrode;
   a graphene layer on the insulator;
   a source contact formed from silver nanowire on a first portion of the graphene film and insulated from the gate by the insulator; and
   a drain contact formed from silver nanowire on a second portion of the graphene film and insulated from the gate by the insulator.

10. The device of claim 1 wherein the optically transparent active device comprises:
    a graphene layer on the substrate;
    an insulator on the graphene layer;
    a gate on the insulator;
    a source contact formed from silver nanowire on a first portion of the graphene film and insulated from the gate by the insulator; and
    a drain contact formed from silver nanowire on a second portion of the graphene film and insulated from the gate by the insulator.

11. A method of forming a passive electrical device, comprising:
    receiving one of a transparent and a substantially transparent substrate;
    forming a graphene layer on a portion of the substrate;
    forming a silver nanowire film on the substrate;
    etching the silver nanowire film; and
    coating a portion of the silver nanowire film with a dielectric material, wherein the dielectric material is not graphene.

12. The method of claim 11, wherein the etching the silver nanowire film further comprises etching the silver nanowire film with an etchant comprising Nickel etchant TFB.

13. The method of claim 11, wherein the coating a portion comprises coating a portion of the silver nanowire film with one of aluminum oxide ($Al_2O_3$), silicon dioxide ($SiO_2$), and hafnium oxide ($HfO_2$).

14. The method of claim 11, wherein the electrical device further comprises one of an antenna, a Frequency Selective Surface, a resistor, capacitor, or an inductor.

15. A device, comprising
one of a substantially and a transparent substrate;
a graphene film on a portion of the substrate;
a plurality of contacts formed from silver nanowire on a portion of the graphene film; and
one of an antenna, a Frequency Selective Surface, a resistor, capacitor, or an inductor.

16. The device of claim 15, wherein the substrate is configured to operate with one of RF-based frequency, -selectivity, -amplification, -switching, and -mixing.

17. The device of claim 15, wherein a gate electrode comprises one of gold, copper, Indium-tin Oxide (ITO) and Indium-zinc Oxide (IZO).

18. A method of forming an electrical device, comprising:
receiving one of a substantially transparent and transparent substrate;
forming a graphene film on a portion of the substrate; and source or drain
forming a plurality of contacts on the graphene film from silver nanowire.

19. The method of claim 18, wherein the providing a substrate further comprises providing a substrate including one of glass and plexiglass.

20. The method of claim 18 further comprising transferring the graphene to the substrate using at least thermal release tape.

21. The method of claim 18 further comprising forming one of a metal line and a slot in the substrate.

22. The method of claim 18 further comprising providing a gate formed from one of gold, copper, Indium-tin Oxide (ITO) and Indium-zinc Oxide (IZO).

23. The method of claim 18 further comprising forming one of an antenna, a Frequency Selective Surface, a resistor, capacitor, or an inductor from silver nanowire.

24. A method of forming an electrical device, comprising:
receiving one of a substantially transparent and transparent substrate;
forming a gate electrode on a portion of the substrate;
forming an insulator over the gate electrode; and
forming a graphene film on a portion of the insulator;
forming a source contact from silver nanowire on a first portion of the graphene film; and
forming a drain contact from silver nanowire on a second portion of the graphene film.

25. The method of claim 24, wherein the providing a substrate further comprises providing a substrate including one of glass and plexiglass.

26. The method of claim 24 further comprising forming one of a metal line and a slot in the substrate.

27. The method of claim 24 further comprising forming the gate from one of gold, copper, Indium-tin Oxide (ITO) and Indium-zinc Oxide (IZO).

28. The method of claim 24 further comprising forming one of an antenna, a Frequency Selective Surface, a resistor, capacitor, or an inductor from silver nanowire.

29. A method of forming an electrical device comprising;
receiving one of a substantially transparent and transparent substrate;
forming a graphene layer on the substrate;
forming an insulator on the graphene layer;
forming a gate on the insulator;
forming a source contact formed from silver nanowire on a first portion of the graphene film and insulated from the gate by the insulator; and
forming a drain contact formed from silver nanowire on a second portion of the graphene film and insulated from the gate by the insulator.

30. The method of claim 29 further comprising forming one of an antenna, a Frequency Selective Surface, a resistor, capacitor, or an inductor from silver nanowire.

* * * * *